United States Patent [19]

Irie et al.

[11] 4,400,795

[45] Aug. 23, 1983

[54] MAGNETIC BUBBLE MEMORY DEVICE

[75] Inventors: Syouzi Irie; Osamu Hirakawa, both of Suzaka, Japan

[73] Assignee: Fujitsu Limited, Kawasaki, Japan

[21] Appl. No.: 297,265

[22] Filed: Aug. 28, 1981

[30] Foreign Application Priority Data

Sep. 1, 1980 [JP] Japan .............................. 55-123080[U]

[51] Int. Cl.$^3$ .............................................. G11C 19/08
[52] U.S. Cl. ....................................................... 365/1
[58] Field of Search .................... 365/1, 2; 360/93, 96, 360/97, 98, 99

[56] References Cited

PUBLICATIONS

Electronics–vol. 54, No. 9, May 5, 1981, pp. 149–151.

Primary Examiner—James W. Moffitt
Attorney, Agent, or Firm—Staas & Halsey

[57] ABSTRACT

A magnetic bubble memory device comprising a cassette holder provided in a main bubble memory apparatus and a magnetic bubble memory cassette which is inserted into the holder so as to be electrically connected with a bubble actuating circuit provided in the main bubble memory apparatus. The device further comprises a detector means for detecting the operation of ejecting the cassette from the holder. The detector means transmits a signal for stopping the bubble motion in advance of the disconnection of the cassette from the bubble actuating circuit.

10 Claims, 11 Drawing Figures

MAGNETIC BUBBLE MEMORY DEVICE

BACKGROUND OF THE INVENTION

The present invention relates to a magnetic bubble memory device, more particularly it relates to improvements in the ejection system of a magnetic bubble memory cassette.

An apparatus utilizing a magnetic bubble memory device for storage of information and performance of logical operation has various advantageous characteristics such as a non-volatile characteristic, a high memory density, a small power consumption, a small size and light weight. Moreover, since the magnetic bubble memory device is a stationary device which does not include any moving mechanical elements but has a very high reliability, great expectations are held for future utilization of this magnetic bubble memory device as a console unit memory or the like. When the magnetic bubble memory device is used as a console unit memory, for example, a memory medium of a portable data recorder, the characteristics of a small size and a light weight are especially important among the above-mentioned characteristics of the magnetic bubble memory device. With this background, there has recently been proposed a method in which a magnetic bubble memory device is contained in a cassette separate from a main apparatus comprising a driving circuit. The reading circuit and the cassette type magnetic bubble memory device is removably attached to the main apparatus. When this method is adopted, since information can be conveyed very simply and since relatively large quantities of information can be contained in a compact cassette by virtue of the characteristic properties of the magnetic bubble memory device, information to be put into a central processing unit can be stored directly at a place where data is acquired. Therefore, a further increase in the processing efficiency can be expected.

When the magnetic bubble memory device is to be stopped, the revolving magnetic field for actuating bubbles in a bubble chip must be stopped at a predetermined angle so as to stop the bubbles at a predetermined position in a transfer pattern of the bubbles. If the bubbles are not stopped at the predetermined position, it becomes difficult to derive the stored data in the bubble chip or the data are destroyed. In a cassette type magnetic bubble memory device, the magnetic bubble memory cassette can be easily pulled out from the main apparatus during the operation of the device. Therefore, there is the possibility of destroying the stored data in the bubble chip by pulling the cassette out of the apparatus by mistake.

The present invention was made in order to obviate the above mentioned drawback of the magnetic bubble memory device of the prior art.

SUMMARY OF THE INVENTION

A magnetic bubble memory device according to the present invention comprises a holder installed in a main apparatus and a magnetic bubble memory cassette which is inserted into the holder so as to be electrically connected with a bubble actuating circuit provided in the apparatus. The device further comprises a detector means for detecting the operation of ejecting the cassette from the holder. The detector means transmits a signal for stopping the bubble motion in advance of the disconnection of the cassette from the actuating circuit.

DESCRIPTION OF THE PREFERRED EMBODIMENTS

Figure 1:
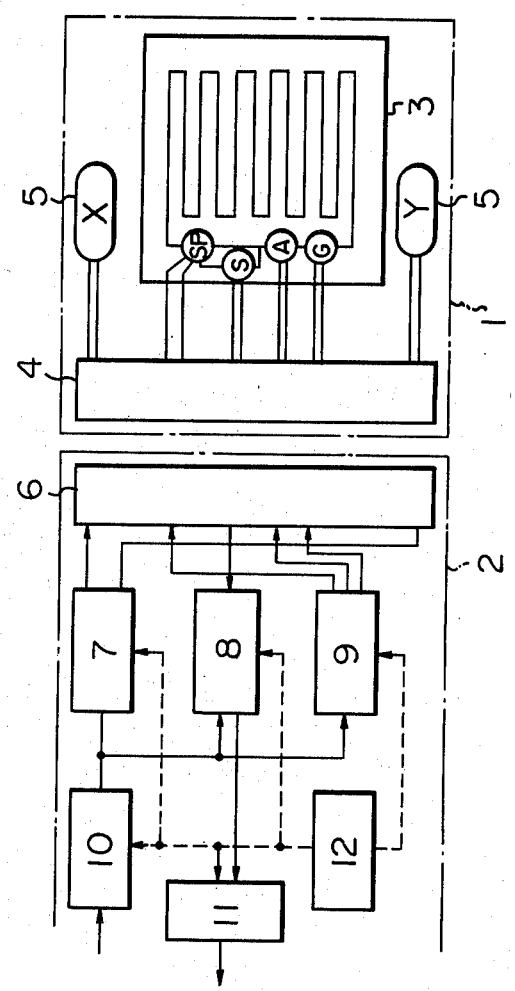
FIG. 1 is a circuit diagram of an example of the magnetic bubble memory device to which the present invention is aplied.

Referring to FIG. 1, a magnetic bubble memory cassette 1 is removably attached to a main apparatus 2. A bubble chip 3 includes functional elements such as a magnetic bubble generator G, a divider SP, a sensor S and an eraser A. A magnetic bubble memory element having a single loop structure is shown in FIG. 1, but a magnetic bubble memory element having a major-minor loop structure can also be similarly used. Reference numeral 4 represents a connector and reference numeral 5 represents a revolving magnetic field-generating coil including X and Y coils arranged to cover the bubble chip 3. Reference numeral 6 represents a connector corresponding to the connector 4 disposed on the side of the cassette 1. A coil driver 7 is laid out to supply a sine or chopping wave current to the coil 5 to generate a revolving magnetic field along the bubble chip face. Reference numeral 8 represents a bubble reading circuit and reference numeral 9 represents a magnetic bubble control circuit including a bubble writing circuit for applying an electric current to the magnetic bubble generator G to generate bubbles, a circuit for applying an electric current to the divider SP to divide bubbles, a circuit for applying an electric current to the sensor S to detect the absence or presence of bubbles and a circuit for applying an electric current to the eraser A to erase unnecessary bubbles. A control circuit 10 is laid out to control the coil driver 7, the bubble reading circuit 8 and the magnetic bubble control circuit 9 according to instruction signals from a central processing unit. Reference numerals 11 and 12 represent a register and a current circuit, respectively. By adoption of the above-mentioned structure, the portable magnetic bubble memory cassette, having a relatively small volume, can be joined to the main apparatus 2 through connectors and can be operated in this joined state when necessary.

Figure 2:
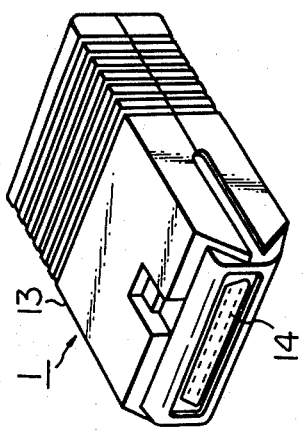
FIG. 2 is a perspective view of a magnetic bubble memory cassette to which the present invention is applied.

FIG. 2 is a perspective view of the magnetic bubble memory cassette 1. A magnetic bubble chip which memorizes data is housed within a case 13 and can be electrically connected to the main apparatus through the connector 4.

Figure 3:
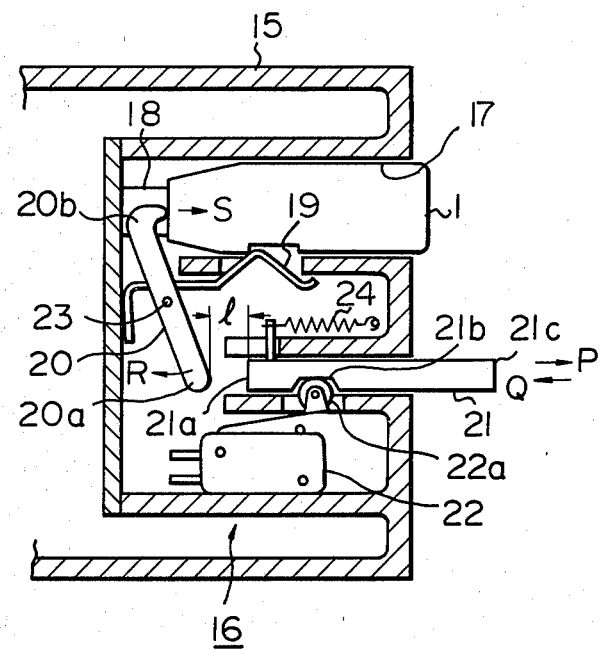
FIG. 3 is a sectional view of a cassette ejection system according to the present invention.

FIG. 3 is a sectional view of an embodiment of an ejection system for ejecting the cassette from the main apparatus according to the present invention. In FIG. 3, reference numeral 15 designates a main apparatus in which the magnetic bubble memory cassette 1 is operated. The main apparatus 15 comprises a holder 16 for receiving the cassette 1. The cassette 1 is inserted through an inlet 17 of the holder 16. A connector 18 is disposed at the rear end of the holder 16 so as to electrically connect the main apparatus and the cassette. The connector 18 engages the connector disposed within the cassette 1. A spring 19 is installed within the holder 16. The spring 19 engages a recess of the cassette 1 so as to retain the cassette 1 within the holder 16. An eject lever 20, a push rod 21, and a switch 22 are also disposed within the holder 16. The eject lever 20 is rotatably mounted on a pin 23. The push rod 21 can abut against an end 20a of the eject lever 20. The switch 22 is actuated by the motion of the push rod 21. The push rod 21 is always biassed toward the direction of the arrow P due to a restoring spring 24. There is a clearance l between the end 20a of the eject lever 20 and the push rod end 21a when the other end 20b of the eject lever 20 abuts against the cassette 1. A recess 21b is formed on the push rod 21. When the push rod 21 is not actuated by an operator, a roller 22a of a switch lever of the switch 22 is received within the recess 21b so that the switch 22 is maintained OFF. The eject lever 20, the push rod 21, the switch 22 and the restoring spring 24 constitute an ejection system of the cassette 1.

The ejection system illustrated in FIG. 3 operates as follows. The magnetic bubble memory cassette 1 is inserted into the holder 16 as illustrated in FIG. 3. When this cassette 1 is to be ejected, the front end 21c of the push rod 21 is pushed toward the direction of the arrow Q. While the push rod 21 advances within the clearance l, the roller 22a of the switch 22 is pushed out of the recess 21b. Therefore, the switch 22 is turned on and transmits a signal for stopping the actuation of the bubble memory cassette to the actuating circuit which actuates the cassette. After that, the push rod 21 is further pushed toward the direction of the arrow Q so that the end 21a of the push rod 21 abuts against the end 20a of the eject lever 20 which is then rotated in the direction of the arrow R. Thereby, the other end 20b of the eject lever 20 pushes the cassette 1 toward the direction of the arrow S so as to eject the cassette 1 out of the holder 16. It takes about 50 μs to stop the motion of the bubbles after the switch 22 is turned on. The clearance l corresponds to that time.

Figure 4:
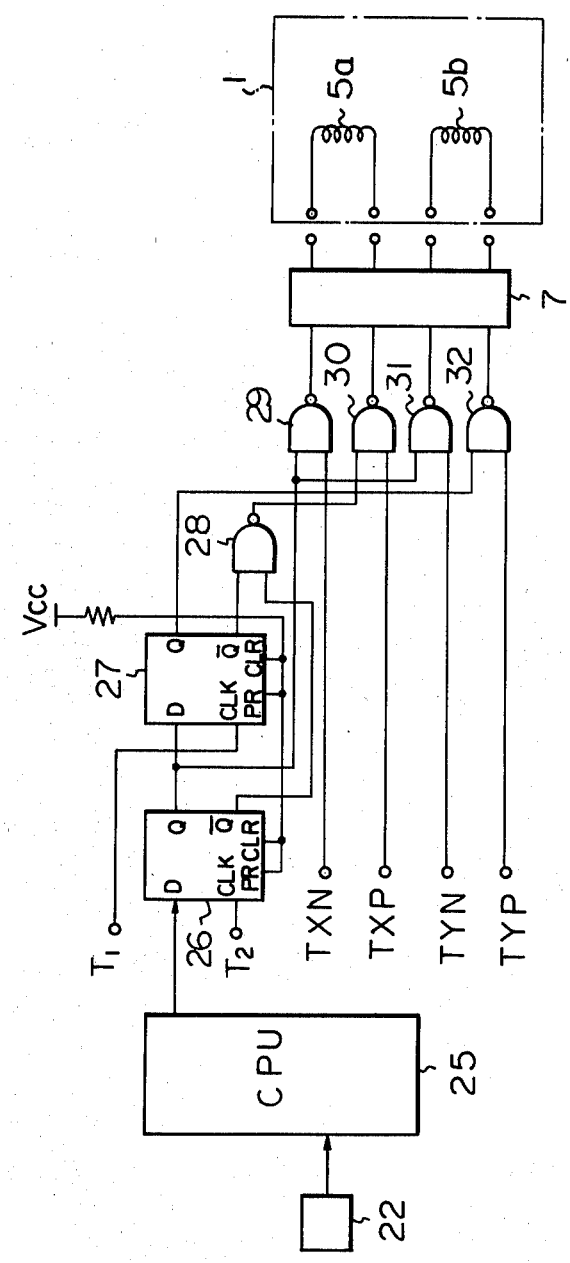
FIG. 4 is a circuit diagram of a circuit for stopping the bubble motion according to the present invention.

Bubbles in the bubble chip are transferred along the loop passage comprising a number of transfer pattern segments disposed in series by the function of the revolving magnetic field generated by the X and Y coils. In order to normally maintain memory within the bubble chip, the bubble motion must start and stop at a predetermined position in the pattern segment. Therefore, the revolving magnetic field must also start and stop at a predetermined angle. FIG. 4 is a circuit diagram for stopping the revolutional magnetic field at a predetermined angle when the aforementioned switch 22 transmits a signal for stopping the bubble motion. The X coil 5a and the Y coil 5b are actuated through the coil driver 7 by negative and positive reference timing signals TXN, TXP, TYN, TYP for controlling the timing of the revolving magnetic field. These reference timing signals are clock signals of rectangular shaped pulses. The signal from the switch 22 for stopping the bubble motion is transmitted to a central processing unit (CPU) 25 which controls the operation of the device. The output signal from the CPU for starting and stopping the revolving magnetic field controls the input timing of the reference signals TXN, TXP, TYN, TYP through two flip flop circuits 26, 27 and five logic circuits 28 through 32 so that the revolving magnetic field generated by the X coil 5a and the Y coil 5b is stopped at the predetermined angle. Reference characters $T_1$ and $T_2$ are clock signals which are input to the flip flop circuits 26, 27, respectively, so as to stop the revolving magnetic field at the predetermined timing.

As mentioned above, according to the ejection system of the magnetic bubble memory cassette according to the present invention, the cassette is ejected after the bubbles are stopped at the predetermined position. Therefore, the data stored in the bubble chip are protected from being destroyed by disconnecting the cassette from the driving circuit while the cassette is being operated.

The switch 22 which detects the ejection of the cassette is not limited to the mechanical switch such as the micro switch illustrated in FIG. 3. An optical sensor comprising a light emitter and a light receiver or a magnetic sensor can be used instead of the mechanical switch 22 so as to detect the movement of the push rod 21.

Figure 5:
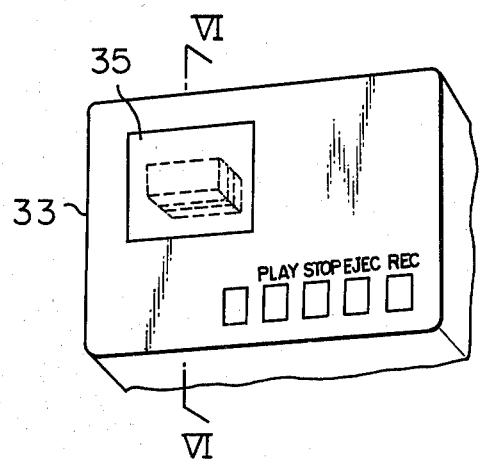
FIG. 5 is a perspective view of a holder of the magnetic bubble memory device to which the present invention is applied.
Figure 6:
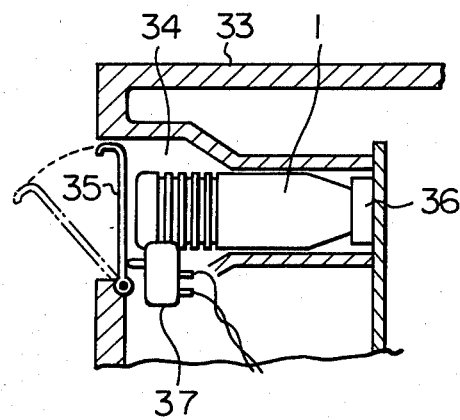
FIG. 6 is a sectional view taken along the line VI—VI in FIG. 5.

FIG. 5 is an outer view of another example of the holder of the cassette. FIG. 6 is a sectional view taken along the line VI—VI in FIG. 5. In the drawings, a holder body 33, a housing portion 34 for receiving a magnetic bubble memory cassette 1, a cover 35 for the housing portion 34, a connector 36 which engages a connector of the cassette 1, and a switch 37 are illustrated. The switch 37 is actuated by the opening or closing motion of the cover 35. The output signal from the switch 37 is transmitted to the CPU 25 which is illustrated in FIG. 4. As mentioned before, the CPU 25 stops the revolving magnetic field at a predetermined angle through the circuit illustrated in FIG. 4.

According to the magnetic bubble memory device of the above construction, bubbles in the cassette 1 can be actuated by the CPU 25 through the coil driver 7 only when the cover 35 is closed. When the cover 35 is opened, the switch 37 transmits a signal for stopping the bubble motion, so that the bubbles are stopped at the predetermind position. When the cassette 1 is to be ejected from the holder 33, the cover 35 is necessarily opened so that the bubble motion is stopped before the cassette 1 is pulled out of the holder 33. Therefore, the disconnection of the cassette 1 during the time when the bubbles are actuated is avoided, thereby preventing the data stored in the bubble chip from being destroyed.

FIGS. 7 through 11 are circuit diagrams for displaying whether the cassette is inserted and whether the bubbles are actuated on a displaying device so as to prevent the cassette from being pulled out of the holder while the cassette is being operated.

Figure 7:
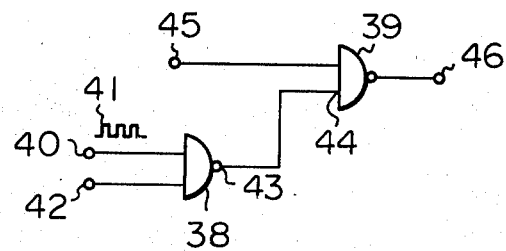
FIG. 7 is a circuit diagram of a circuit for displaying the bubble cassette condition according to the present invention.

A first example of the circuit is illustrated in FIG. 7. This circuit comprises a first NAND circuit 38 and a second NAND circuit 39. An on-and-off signal 41 is introduced into an input terminal 40 of the first NAND circuit 38. A bubble actuating signal is introduced into the other input terminal 42. The output terminal of the first NAND circuit 38 is connected to an input terminal 44 of the second NAND circuit 39. A cassette connection signal is introduced into the other input terminal 45 of the second NAND circuit 39. The output terminal 46 of the second NAND circuit 39 is connected to a circuit for actuating a display lamp which is not illustrated in this drawing.

Figure 8:
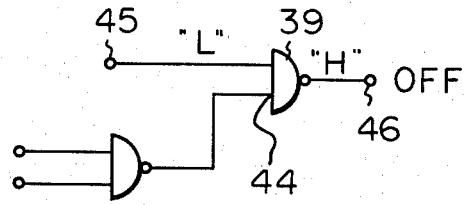
FIGS. 8 through 10 are circuit diagrams for explaining the operation of the circuit of FIG. 7.

The function of this circuit will be explained with reference to FIGS. 8 through 10. FIG. 8 represents a condition in which the cassette is not inserted and the bubble actuating signal is not introduced. In this condition, a signal of "L" level is introduced into the input terminal 45 of the second NAND circuit 39. Therefore, the output signal from the output terminal 46 of the second NAND circuit 39 is "H" level irrespective of the signal introduced to the other input terminal 44. The circuit for actuating the display lamp is constructed so that the signal of "H" level from the second NAND circuit turns off the lamp. Therefore, in this condition, the lamp is turned off.

Figure 9:
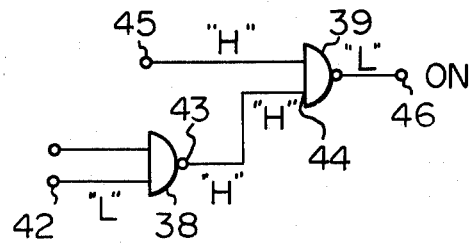
Figure 10:
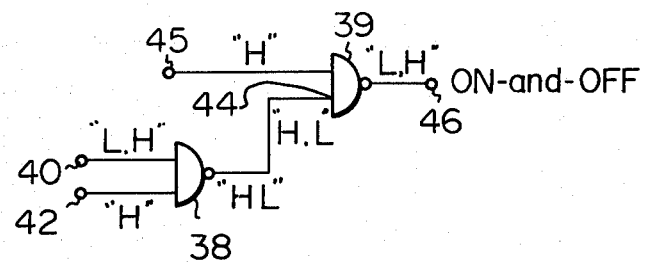

When the cassette is inserted into the holder, a signal of "H" level is introduced to the input terminal 45 of the second NAND circuit 39 as illustrated in FIG. 9. If the cassette is not operated, the input terminal 42 of the first NAND circuit 38 receives a signal of "L" level since the actuatng signal is not introduced to this input terminal 42. Therefore, the signal from the output terminal 43 becomes "H" level whichis introduced to the input terminal 44 of the second NAND circuit 39. Accordingly, the output signal from the second NAND circuit becomes "L" level which signal turns on the display lamp.

When the cassette is to be operated, the actuating signal and the on-off signal 41 (FIG. 7) are simultaneously introduced to the first NAND circuit 38. Therefore, the signal of "H" level is introduced to the input terminal 42 and the signal of "L·H" level is introduced to the other input terminal 40 of the first NAND circuit as illustrated in FIG. 10. Accordingly, the level of the output signal from the first NAND circuit is "H·L" level which is inverted from the on-and-off signal of "L·H" level. The output signal of "H·L" level is introduced to the input terminal 44 of the second NAND circuit 39. The cassette connection signal of "H" level is already introduced to the input terminal 45 of the second NAND circuit 39. Therefore, an on-and-off signal of "L·H" level is transmitted from the output terminal 46 of the second NAND circuit 39, by which the display lam is turned on and off repeatedly.

Figure 11:
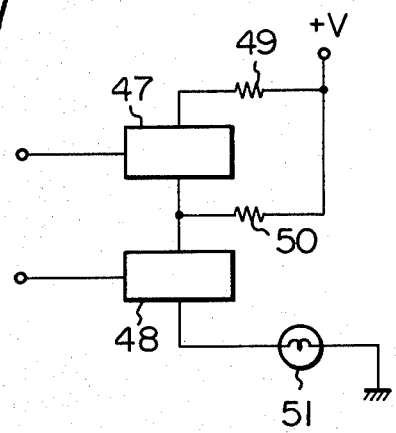
FIG. 11 is another circuit diagram of a circuit for displaying the bubble cassette condition according to the present invention.

FIG. 11 represents another example of a circuit diagram for displaying whether the cassette is inserted and whether the cassette is being operated. In this circuit, a resistance 49, switches 47 and 48, and lamp 51 are connected in series to a power source +V. Another resistance 50 is connected between the power source +V and the portion between the two switches 47 and 48. The switch 47 is actuated by the bubble actuating signal. The other switch 48 is actuated by the cassette connection signal. The value of the resistance 49 is about the same as the value of the resistance 50.

The function of this circuit is as follows. When the cassette is not inserted into the holder, the switch 48 is turned off so that the lamp 51 is turned off. When the cassette is inserted into the holder, the cassette connection signal makes the switch 48 turn on. Therefore, current flows through the lamp 51, through the resistance 50 and the switch 48. Luminous intensity of the lamp 51 is low in this condition. When the cassette is being operated, the bubble actuating signal makes the switch 47 turn on so that the resistance 49 is connected to the resistance 50 in parallel. Therefore, the luminous intensity of the lamp 51 is increased since the total value of resistances 49, 50 in parallel is lower than the value of the resistance 50 alone.

As mentioned above, these examples of circuit diagrams ddisplay the situation in which the cassette is housed in the holder by lighting the lamp in the first example or by dimly lighting the lamp in the second example. Also, these circuits make it possible to display the situation in which the cassette is operated by turning the lamp on and off in the first example or by enhancing the luminous intensity of the lamp in the second example. Therefore, it is possible to avoid disconnection of the cassette by pulling out the cassette from the holder during operation. Therefore, data stored in the bubble chip are normally retained.

We claim:

1. A magnetic bubble memory device comprising:
   a main bubble memory apparatus having a bubble actuating circuit and a holder;
   a magnetic bubble memory cassette which is inserted into said holder so as to be electrically connected with said bubble actuating circuit provided in said main apparatus;
   detector means for detecting the operation of disconnecting said magnetic bubble memory cassette from said holder, said detector means including means for transmitting a signal for stopping the bubble motion caused by said bubble actuating circuit in advance of the disconnection of said magnetic bubble memory cassette from said bubble actuating circuit.

2. A magnetic bubble memory device according to claim 1, further comprising means, operatively connected to said detector means and said bubble actuating circuit, for stopping the revolving magnetic field for actuating bubbles at a predetermined angle.

3. A magnetic bubble memory device according to claim 2, further comprising a pushing member for ejecting said magnetic bubble memory cassette, wherein said detector means comprises a switch having a mechanical switching contact actuated by said pushing member.

4. A magnetic bubble memory device according to claim 2, further comprising a pushing member for ejecting said magnetic bubble memory cassette, wherein said detector means comprises an optical sensor for detecting the movement of said pushing member.

5. A magnetic bubble memory device according to claim 2, further comprising a pushing member for ejecting said magnetic bubble memory cassette, wherein said detector means comprises a magnetic sensor for detecting the movement of said pushing member.

6. A magnetic bubbe memory device according to claim 2, further comprising a cover pivotally mounted on said holder, wherein said detector means comprises a switch actuated by the opening and closing motion of said cover for said holder.

7. A magnetic bubble memory device according to claim 1, further comprising display means for generating a display to indicate if said magnetic bubble memory cassette is inserted in said holder and to indicate if said magnetic bubble memory cassette is being operated by said bubble actuating circuit.

8. A magnetic bubble memory device capable of receiving a cassette, comprising:
   a bubble actuating circuit;

a cassette holder having an inlet for receiving the cassette, said cassette holder electrically connecting said bubble actuating circuit and the cassette;

means for ejecting said cassette from said cassette holder; and means for detecting the actuation of said ejecting means and for generating a disable signal to disable said bubble actuating circuit, thereby stopping bubble motion in said cassette prior to the electrical disconnection of said cassette from said bubble actuating circuit.

9. A magnetic bubble memory device according to claim 8, further comprising means, operatively connected between said detecting means and said bubble actuating circuit, for receiving the disable signal and for stopping the revolving magnetic field for actuating bubbles at a predetermined angle.

10. A magnetic bubble memory device according to claim 8 or 9, wherein said ejecting means comprises:

an eject lever, pivotally mounted on said cassette holder, having a first end and having a second end positioned so as to abut the cassette when the cassette is inserted in said holder;

a push rod mounted for slideable movement in said holder along an axis intersecting the first end of said eject lever when the cassette is inserted in said cassette holder; and means for biasing said push rod so that the first end of said push rod is normally displaced from the first end of said eject lever, wherein when said push rod is moved against the force of said biasing means, said detecting means detects the movement of said push rod prior to the time said push rod contacts the first end of said eject lever.

* * * * *

UNITED STATES PATENT AND TRADEMARK OFFICE
CERTIFICATE OF CORRECTION

PATENT NO. : 4,400,795
DATED : AUGUST 23, 1983
INVENTOR(S) : SYOUZI IRIE ET AL.

It is certified that error appears in the above-identified patent and that said Letters Patent is hereby corrected as shown below:

Col. 3, line 23, change "1" to --$\ell$--;
line 30, "lever20" should be --lever 20--;
line 39, "1" should be --$\ell$--;
line 52, "1" should be --$\ell$--;
line 62, after "gram" insert --of a circuit--; and "revolutional" should be --revolving--.

Col. 5, line 26, "whichis" should be --which is--;
line 47, "1am" should be --lamp--.

Col. 6, line 6, "ddisplay" should be --display--;
line 55, "bubbe" should be --bubble--.

Signed and Sealed this

Eighth Day of November 1983

[SEAL]

Attest:

GERALD J. MOSSINGHOFF

Attesting Officer

Commissioner of Patents and Trademarks